United States Patent [19]

Wise et al.

[11] 4,169,995
[45] Oct. 2, 1979

[54] PULSE REPETITION FREQUENCY TRACKER

[75] Inventors: Carl D. Wise; Richard J. Wiegand, both of Severna Park, Md.

[73] Assignee: The United States of America as represented by the Secretary of the Air Force, Washington, D.C.

[21] Appl. No.: 12,879

[22] Filed: Jan. 21, 1970

[51] Int. Cl.² .......................... H03K 1/17; H03K 5/20
[52] U.S. Cl. ...................................... 328/63; 328/109; 307/233 R
[58] Field of Search .................. 328/109, 110, 139, 63; 307/233 R

[56] References Cited

U.S. PATENT DOCUMENTS

| 3,007,044 | 10/1961 | Cookson | 328/139 X |
| 3,484,704 | 12/1969 | Hungerford | 328/139 |
| 3,550,017 | 12/1970 | Whalen | 328/139 X |

Primary Examiner—Malcolm F. Hubler
Attorney, Agent, or Firm—Joseph E. Rusz; George Fine

[57] ABSTRACT

The repetition frequency tracking apparatus utilizes the input signal to start a timer to provide the correct phase. When the timer sweeps through the right frequency, the tracker will lock to a single pulse train within a two octave frequency spectrum. After the lockup, the tracker is switched to a free running mode to provide pseudo synchronous running through durations of missing input pulses. Accurate tracking is provided by the use of an early late gate phase discriminator for phase sensing and correcting to zero, errors at all locking frequencies.

7 Claims, 2 Drawing Figures

PULSE REPETITION FREQUENCY TRACKER

BACKGROUND OF THE INVENTION

This invention relates to a pulse repetition frequency tracker and particularly with an improved means of acquiring and locking to a single pulse train within a two octave frequency range and maintaining lock through periods of missing input information.

In many communications systems it is desirable if not an essential function that a pulse repetition frequency tracker be included. This type of tracking provides the mechanism by which the arrival of a pulse can be predicted and/or anticipated. A typical use of this information would be to correlate it with the incoming received input and thus lessen the chance of false alarms.

The prior art systems utilizing conventional techniques for pulse repetition tracking have several limitations. In many applications the pulse repetition tracking is confined to a small frequency spectrum. Attempts to extend the range beyond one octave of harmonic locking may leave pulses undetected. The possibility of a wider frequency range may be obtained through the use of a standard phase lock loop. However, this device locks to a varying phase angle to the input as a function of the operating frequency.

A further limitation of the prior art systems which is common in the conventional trackers and typical of phase lock loops is the difficulty in handling multiple signal inputs. In actual practice, many input signals are present and it is essential to acquire and lock to a particular single input signal.

SUMMARY OF THE INVENTION

The present invention utilizes a timing device and a control unit to sweep in frequency with a narrow lock gate to acquire both the proper frequency and phase of the incoming signal. The control unit then switches to a free running mode from the initially passive timing. In this mode the tracker will continue to recycle even through a series of pulses are missing. An early late gate phase discriminator provides a phase locking method which drives the timer unit into zero phase error with the input signal at all locking frequencies.

It is one object of the invention, therefore, to provide an improved pulse repetition frequency tracker apparatus utilizing the input signal to start a timer to acquire the proper frequency and the correct phase of the incoming signal.

It is another object of the invention to provide an improved pulse repetition frequency tracker apparatus which will lock to a single pulse train within a two octave frequency spectrum even in a heavy pulse environment.

It is yet another object of the invention to provide a tracker apparatus having a free running mode to enable it to continue running synchronously through periods of missing input information.

It is still another object of the invention to provide a tracker apparatus utilizing an early/late gate phase discriminator to phase sense and correct to zero errors at all locking frequencies.

These and other advantages, features and objects of the invention will become more apparent from the following description taken in connection with the illustrative embodiment taken in connection with the accompanying drawings, wherein:

DESCRIPTION OF THE PREFERRED EMBODIMENT

Figure 1:
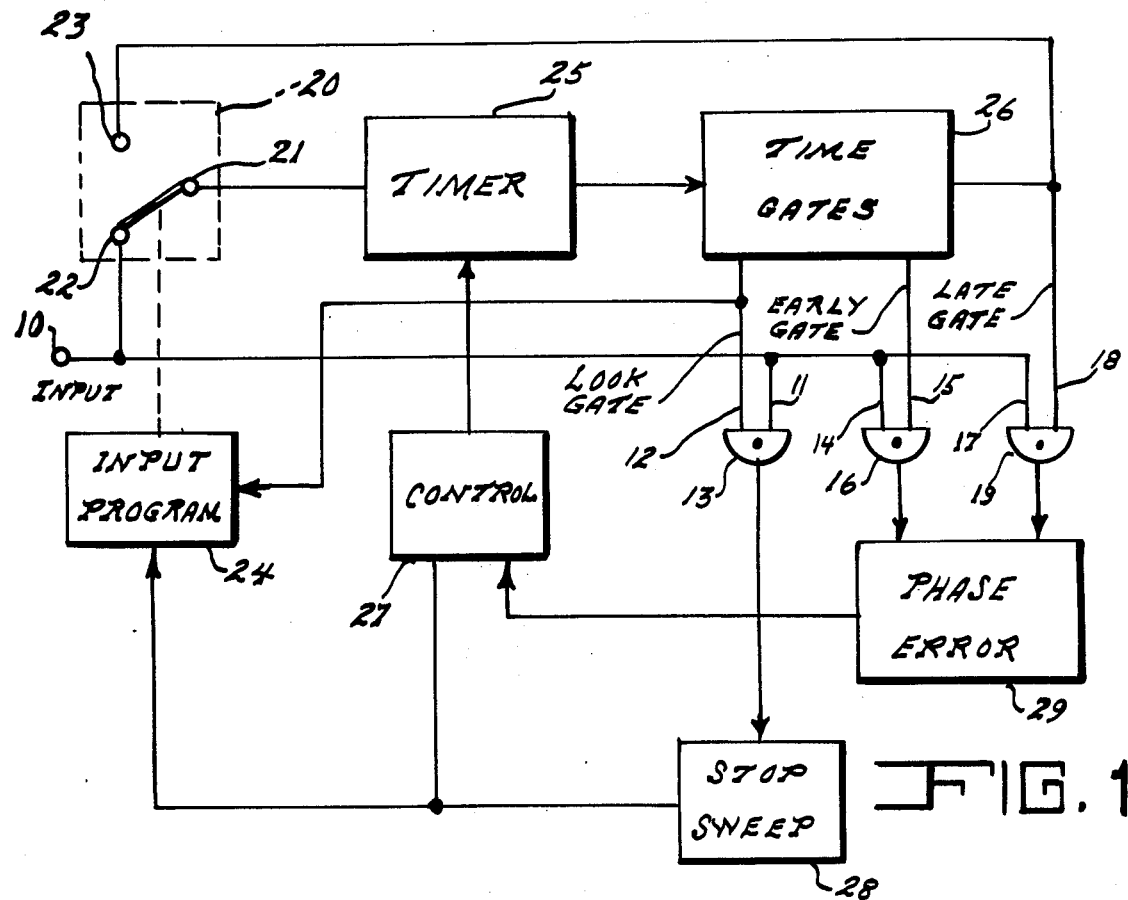
FIG. 1 is a schematic diagram of the pulse repetition frequency tracker apparatus in accordance with this invention.

Referring now to FIG. 1, there is shown a pulse repetition frequency tracker apparatus having an input terminal 10 to receive input pulse train. The input terminal 10 is directly connected to input 11 of look gate 13, input 14 of early gate 16 and input 17 of late gate 19. A switching unit 20 which is activated by input program unit 24 has its center arm 21 connected to timer unit 25. Contact terminal 22 of switching unit 20 is connected to input terminal 10. Contact terminal 23 of switching unit 20 is connected to the output of time gate unit 26 and to input 18 of late gate 19. Timer unit 25 which receives a control signal from contact unit 27 is connected to time gates unit 26. Timing signal from times gates unit 26 are provided to input 12 of look gate 13, input 15 of early gate 16 and input 18 of late gate 19. The output signals of early gate 16 and late gate 19 are received by phase error unit 29 which provides an output signal to control unit 27. Stop sweep unit 28 receives an output signal from look gate unit 13 and provides a common output signal to both input program unit 24 and control unit 27. Input program unit 24 also receives a timing signal from time gate unit 26 which simultaneously applies that timing signal to look gate 13.

The pulse repetition frequency tracker has two basic modes of operation. In the initial mode, the pulse repetition frequency tracker is in the search mode and the input pulse signal which is received at input terminal 10 is gated in to trigger the timer unit 25. The timer unit 25 is comprised of two monostable multivibrators which are connected one after the other. This is done so that each monostable multivibrator will never have more than a fifty percent duty cycle. When the pulse repetition frequency tracker is in the search mode, it sweeps in frequency with the narrow look gate 13 to approximately acquire both the proper frequency and phase with the control circuitry before the servo makes the final adjustment. This is accomplished by the program unit 24 holding the center arm 21 of switching unit 20 in contact with contact terminal 22, thus triggering the voltage controlled multivibrators by the input pulses while being swept by the control 27. Therefore, at any given instance, the total period of the multivibrators plus about one half of the look gate 13 determines the frequency that the tracker is sweeping through. The triggering of the multivibrators by the input pulse establishes the look gate 13 at zero phase. At the conclusion of the timing cycle a series of gates are generated. If an input pulse appears within the look gate 13, then it may be assumed that the frequency of the incoming pulse train is identified. When the pulse train is identified, the stop sweep unit 28 is triggered and the tracker goes into the free running mode. After three pulses have been detected in the gate, the input switch 20 is thrown to allow internal triggering. The input program 24 may comprise any conventional logic circuit which may be to detect or count a given number of pulses. For illustration, the input program 24 may comprise two flip-flops and several gates to count the initial three pulses. Thus, the free running mode is established by an output signal from the stop sweep unit 28 which triggers input program unit 24 to switch the center arm 21 to contact terminal 23. The mode change between sweep and track is controlled by stop sweep 28. The mechanization may be a standard memory controller. When an input occurs in the Look Gate, a capacitor is charged up. As The capacitor discharges its voltage decays. As long as pulses continue to appear in the gate, the capacitor remains charged up. If the pulses disappear from the gate, the capacitor will eventually discharge below a threshold and the stop sweep signal will be removed.

Figure 2:
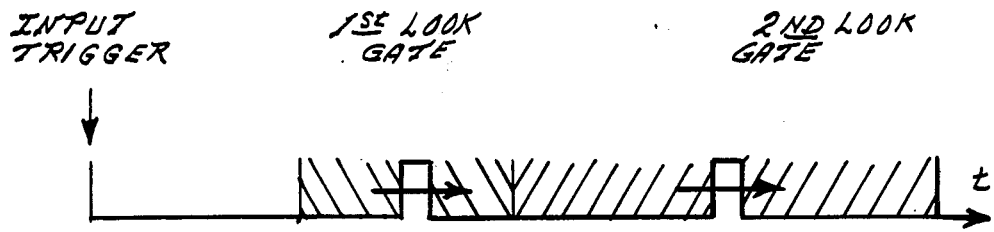
FIG. 2 is a plot of the two octave time sweep illustrating the first and second look gate range.

In typical operation, the tracker will continue to search the spectrum and to be triggered by the pulses from many input pulse trains, until a trigger from one particular pulse train comes in while the tracker is at its frequency with a tolerance which is determined by the width of the look gate 13. If no input pulse appeared during the look period the timer unit 25 is recycled in an effort to identify the pulse train at half the frequency (which is twice the period). Refer to FIG. 2 and the timer unit 25 which is recycling at twice the pulse train period will be clearly shown. If a pulse does not appear within the look gate in the second cycle, the timer unit 25 stops and waits for another trigger pulse to be received at the input terminal 10. In the search mode the timer unit 25 is continuously swept through the octave of frequencies. FIG. 2 illustrates the two octave range that is developed. By recycling the timer unit 25 and developing a second look gate, the second octave of frequencies is added. The utilization of a frequency range of two octaves enables searching throughout these frequency ranges without the risk of missing pulses. This is accomplished by searching at the end of the first and second timing cycles for the second pulse. Also, by sweeping both of the octaves simultaneously in this manner is a time savings and requires less frequency range in the time unit 25.

A control unit 27 switches the tracker from the initially passive timing (search) to a free running (track) mode. The period of the timer 35 is determined by a voltage which is received from the control unit 27. A constant current source dumped onto a capacitor provides the sweep voltage for the search mode. A stop sweep signal transfers voltage control from the sweep current source to another source. A small bipolar current source from the "Phase Error" measurement provides track control. In the free running mode the tracker will continue to recycle even though a series of pulses are missing. If this mode of operation had not been incorporated, then the tracker in a multi-signal environment would begin to trigger off another pulse train, the first time a pulse was missing. Since the timer unit 25 was started by the first pulse and agreed with the arrival of the second pulse, the approximate phase and frequency of the incoming pulse train have been determined. Thus, only slight corrections are required to be made on the timer unit 25 by the phase loop to keep the tracker locked to the incoming pulses. The amount of the input pulse which appears in the early gate 16 is compared with that appearing in the late gate 19 and the difference is integrated by phase error unit 29 into a voltage which through control unit 27 controls the timer unit 25. Thus, the phase error unit 29 provides a phase locking method by which the timer unit 25 is driven into zero phase error with the input at all locking frequencies. The phase error unit 29 may be a conventional early/late gate phase discriminator.

The most important characteristic of the free running mode is that the imput pulse is no longer required to recycle the timer unit 25. The late gate 18 is now used as the trigger source. The system is now truly in a free running mode and is dependent upon the input pulse only for phase information. The input program unit 24 provides the control of whether the timer unit 25 is triggered by the received input pulse or by the late gate 18. Initially when an input pulse triggers the timer unit 25, the input program unit 24 maintains the switching unit 20 in the closed position (center arm 21 is connected to contact terminal 22) for two timing cycles. During all this time, the tracker circuit is insensitive to false triggers except during the time of the look gate 13. In the pulse repetition frequency tracker design that is utilized, the look gate 13 is typically a low duty cycle pulse. In the look gate's present use in the system, its time represents 0.5 percent of the total timing period.

Although the invention has been described with reference to a particular embodiment, it will be understood to those skilled in the art that the invention is capable of a variety of alternative embodiments within the spirit and scope of the appended claims.

We claim:

1. A pulse repetition frequency tracker apparatus comprising in combination:
   an input terminal,
   a timer means, said timer means comprising a timer unit and a time gates unit, said timer unit providing timing signals to said time gates unit, said timer unit receiving an input pulse train from said input terminal and locking onto said pulse train; and
   a control means connected to receive said input pulse train from said input terminal comprising a phase error discriminator unit connected to said timer gates unit for phasing sensing and correcting said timing signals of said timer unit to zero phase error, and a search look gate unit for acquiring the proper frequency and phase of said input pulse train.

2. A pulse repetition frequency tracker apparatus as described in claim 1 wherein said phase error discriminator unit is comprised of an early gate unit to detect early pulses of said input pulse train, a late gate unit to detect late pulses of said input pulse train,
   a phase error unit arranged to receive the outputs of said early/late gate units and a control unit arranged to receive the output of said phase error unit and connected to said timer unit.

3. A pulse repetition frequency tracker apparatus as described in claim 1 wherein said timer unit will lock onto said input pulse train within a two octave frequency spectrum.

4. A pulse repetition frequency tracker apparatus as described in claim 2 wherein said search look gate unit comprises a look gate, providing an output signal, a stop-sweep unit receiving said output signal of said look gate, said stop sweep unit being connected to said control unit.

5. A pulse repetition frequency tracker apparatus as described in claim 4 further including a switching means having a center arm, a first contact terminal and a second contact terminal, said center arm being connected to said timer unit, said second contact terminal being connected between said time gates unit and said phase error discriminator unit, said first contact terminal being connected to said input terminal, and an input program unit receiving signals from said time gates unit and said stop sweep unit to control the position of said center arm.

6. A pulse repetition frequency tracker apparatus as described in claim 5 wherein said tracker operates in the search mode when said center arm is held in contact with said first contact terminal by said input program unit.

7. A pulse repetition frequency tracker apparatus as described in claim 5 wherein said tracker operates in the free running mode when said center arm is held in contact with said second contact terminal by said input program unit.

* * * * *